United States Patent
Saito et al.

(10) Patent No.: US 6,828,842 B2
(45) Date of Patent: Dec. 7, 2004

(54) SEMICONDUCTOR INTEGRATED CIRCUIT DEVICE

(75) Inventors: Kayoko Saito, Hamura (JP); Mitsugu Kusunoki, Kunitachi (JP); Hiroyasu Ishizuka, Ome (JP); Shinichiro Masuda, Hamura (JP)

(73) Assignees: Hitachi, Ltd., Tokyo (JP); Hitachi ULSI Systems Co, Ltd., Tokyo (JP)

( * ) Notice: Subject to any disclaimer, the term of this patent is extended or adjusted under 35 U.S.C. 154(b) by 0 days.

(21) Appl. No.: 10/443,035

(22) Filed: May 22, 2003

(65) Prior Publication Data

US 2003/0227304 A1 Dec. 11, 2003

(30) Foreign Application Priority Data

Jun. 10, 2002 (JP) ........................................ 2002-168680

(51) Int. Cl.[7] .............................. H03K 5/08; H03L 5/00
(52) U.S. Cl. ...................................... 327/318; 327/319
(58) Field of Search ................................. 327/306, 309, 327/310, 311, 318, 319, 320, 321, 324, 331, 333; 361/91.1, 91.5

(56) References Cited

U.S. PATENT DOCUMENTS

| | | | | |
|---|---|---|---|---|
| 5,886,558 A | * | 3/1999 | Iijima et al. | 327/310 |
| 5,907,464 A | | 5/1999 | Maloney et al. | 361/111 |
| 6,400,546 B1 | * | 6/2002 | Drapkin et al. | 361/111 |
| 6,462,601 B1 | * | 10/2002 | Chang et al. | 327/313 |
| 6,504,418 B1 | * | 1/2003 | Coughlin, Jr. | 327/319 |
| 6,650,164 B2 | * | 11/2003 | Kondo | 327/309 |

FOREIGN PATENT DOCUMENTS

| | | |
|---|---|---|
| JP | 10-303314 | 4/1997 |
| JP | 11-243639 | 2/1998 |

* cited by examiner

*Primary Examiner*—Tuan T. Lam
(74) *Attorney, Agent, or Firm*—Reed Smith LLP; Stanley P. Fisher, Esq.; Juan Carlos A. Marquez, Esq.

(57) ABSTRACT

A first clamp circuit and a second clamp circuit stacked thereon in vertical respectively for clamping unwanted level voltages are provided between the high potential side power source and low potential side power source and an intermediate node formed by vertical stacking of the first clamp circuit and second clamp circuit is coupled with the power source for internal circuit. Since a capacitor originally provided in the internal circuit is allocated in parallel to the first clamp circuit, impedance is reduced due to existence of the capacitor and potential difference due to over-current flowing in the chip is reduced. Accordingly, potential difference due to over-current flowing into the chip may be reduced and static electricity dielectric strength can be improved by allowing higher over-current. Thereby, impedance when the clamp circuits are stacked in two stages.

5 Claims, 15 Drawing Sheets

SEMICONDUCTOR INTEGRATED CIRCUIT DEVICE

BACKGROUND OF THE INVENTION

The present invention relates to a semiconductor integrated circuit device and particularly to the technique for preventing breakdown of an element by clamping unwanted high voltage when it is applied to an input terminal of the same semiconductor integrated circuit device.

It is important in a semiconductor integrated circuit to assure static electricity dielectric strength. As the technique for attaining the static electricity dielectric strength of the semiconductor integrated circuit, the technique for effective application of the integration area and releasing sudden voltage change such as surge voltage with the simplified structure is well known as described, for example, in the Japanese Unexamined Patent Publication No. Hei 11 (1999)-243639. According to this technique, a change signal which changes corresponding to generation of change in the voltage of the supplied DC voltage is generated and the switching control is conducted for the switching element pair to eliminate change of voltage based on the switching element pair for complementarily outputting the signal to the external circuit and the given input signal and the signal generated by the signal generating unit.

Moreover, the Japanese Unexamined Patent Publication No. Hei 10 (1998)-303314 discloses the technique to prevent input of static electricity to an input circuit when a surge voltage is applied. According to this technique, input of static electricity to the input circuit can be prevented by providing an input circuit which is connected to the power source line and the ground line and is also given the signal from the input terminal to process this signal and an input protection circuit in the power source side for bypassing, to the power source line, charges due to the first surge voltage inputted to the input terminal in the power source voltage direction or a power source protection circuit connected between the power source line and the ground line for bypassing, to the ground line, charges due to the first surge voltage bypassed to the power source line with the input protection circuit in the power source side.

Moreover, a circuit technique is also known in which the clamp circuit is stacked in two stages in the semiconductor integrated circuit to which the power source of the higher level exceeding the dielectric strength of a MOS transistor is supplied (for example, U.S. Pat. No. 5,907,464). In such a circuit, to the intermediate node which is formed by stacking in two stages the clamp circuit, an intermediate potential generated by an intermediate potential generating circuit is supplied. The intermediate potential generating circuit is formed of the serial connection of two p-channel type MOS transistors and the power source is divided with the serial connection circuit of these MOS transistors.

SUMMARY OF THE INVENTION

In the technique where the clamp circuits are stacked in two stages, an intermediate potential is generated with a serial connection circuit of two elements (for example, p-channel MOS transistor) and this potential is supplied to an intermediate node in the semiconductor integrated circuit device to which a high level power source exceeding the dielectric strength of MOS transistor is supplied, impedance between the high potential side power supply and low potential side power source becomes two times the impedance of single stage of the clamp circuit. According to the investigation by the inventors of the present invention, it has been found that if impedance is not sufficiently lower, the clamp circuit cannot sufficiently show an over-current bypassing function and therefore improvement in static electricity dielectric strength may be interfered.

Therefore, an object of the present invention is to provide the technique for clamping potential of unwanted level with a low impedance in the case where the clamp circuits are stacked in two stages.

The above-described and other objects and the novel features of the present invention will become more apparent from the description of this specification and the accompanying drawings.

The typical inventions disclosed in the present invention will be briefly described as follows.

Namely, in a semiconductor integrated circuit device including an input terminal for a high potential side power source, an input terminal for a low potential side power source and an internal circuit which is operated when the power source for internal circuit of the level lower than voltage of the high potential side power source is supplied, the first clamp circuit for clamping the voltage of unwanted level and the second clamp circuit which is vertically stacked on the first clamp circuit are provided between the high potential side power source and low potential side power source and an intermediate node formed by vertical stacking of the first clamp circuit and second clamp circuit is coupled with the power source for internal circuit.

In the internal circuit, capacitors for reducing noise included in the power source for internal circuit are provided in various points through coupling with the power source for internal circuit and the low potential side power source. Therefore, the composite capacitance of these capacitors becomes large and the impedance can controlled to the lower value.

According to the means described above, since the power source for internal circuit which is provided as the operation power source of the internal circuit is supplied to the intermediate node, a capacitor which is originally provided in the internal circuit is allocated in parallel with the first clamp circuit. Accordingly, an impedance is reduced and thereby potential difference due to an over-current flowing into a chip becomes small. As a result, a larger over-current is allowed to flow and dielectric strength for static electricity can also be improved.

In this case, the internal circuit described above may be configured with inclusion of a logic circuit which is formed of a thin film transistor coupled with the power source for internal circuit and a noise reduction capacitor provided between the power source for internal circuit and low potential side power source.

Moreover, it is also possible to provide a power source generating circuit for internal circuit in order to generate the power source for internal circuit by lowering the voltage of the high potential side power source.

In addition, an output circuit which can output a signal to the external circuit when the power source for input/output circuit different from the power source for internal circuit is supplied and the third clamp circuit provided between the power source for input/output circuit and the low potential side power source to clamp the voltage of unwanted level may also be provided.

An input terminal and an input circuit which is operated when the power source for internal circuit is supplied to fetch the signal transferred via the input terminal may also be provided and thereby the input circuit may be formed of an input transistor for obtaining the signal fetched via the input terminal and a diode for preventing static electricity breakdown to form the continuity route to the power source for the input/output circuit.

When the first clamp circuit is coupled with the low potential side power source and the second clamp circuit is coupled with the high potential side power source, the second clamp circuit may be comprised of a time constant circuit forming a reference voltage within the range of the predetermined time constant, an inverter circuit which can detect a potential difference between the high potential side power source and the power source for internal circuit based on the reference voltage, a MOS transistor which can terminating the high potential side power source and power source for internal circuit based on the output logic of the inverter circuit, and a resistor for impeding a through-current flowing into the MOS transistor and inverter circuit during the normal operation.

Moreover, it is also possible to include a rewiring layer having a lower wiring resistance to the wiring in the high potential side power source, low potential side power source and power source for internal circuit.

DESCRIPTION OF THE PREFERRED EMBODIMENTS

Figure 17:
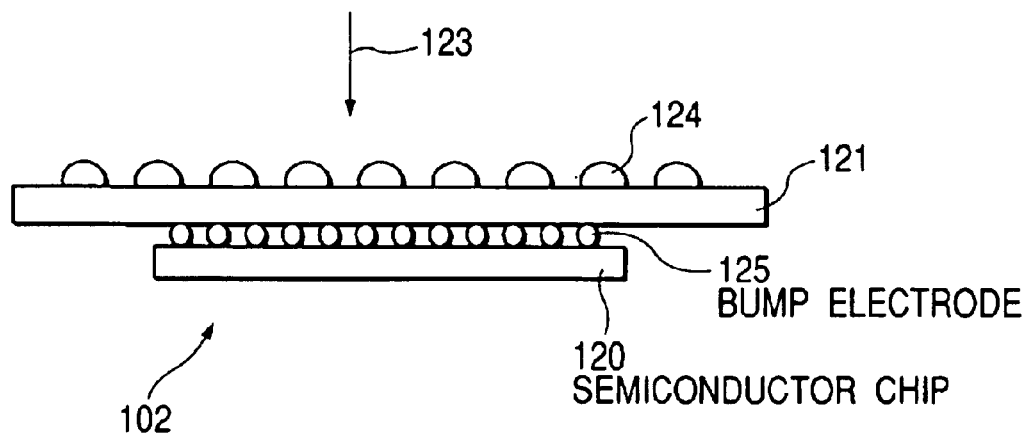
FIG. 17 is a diagram for describing an example of the structure of SRAM.

FIG. 17 illustrates an SRAM as an example of a semiconductor integrated circuit device of the present invention.

The SRAM 102 illustrated in FIG. 17 is formed, although not particularly restricted, of a semiconductor chip 120 and a BGA (ball grid array) substrate 121 coupled to the semiconductor chip. The semiconductor chip 120 is formed, although not particularly restricted, on a semiconductor substrate such as a single crystal silicon substrate with the known semiconductor integrated circuit device technology. The BGA substrate 121 includes a BGA ball 124 as the external terminal to realize electrical coupling with an element mounting substrate. The semiconductor chip 120 and BCA substrate 121 are electrically coupled via a bump electrode 125.

Figure 1:
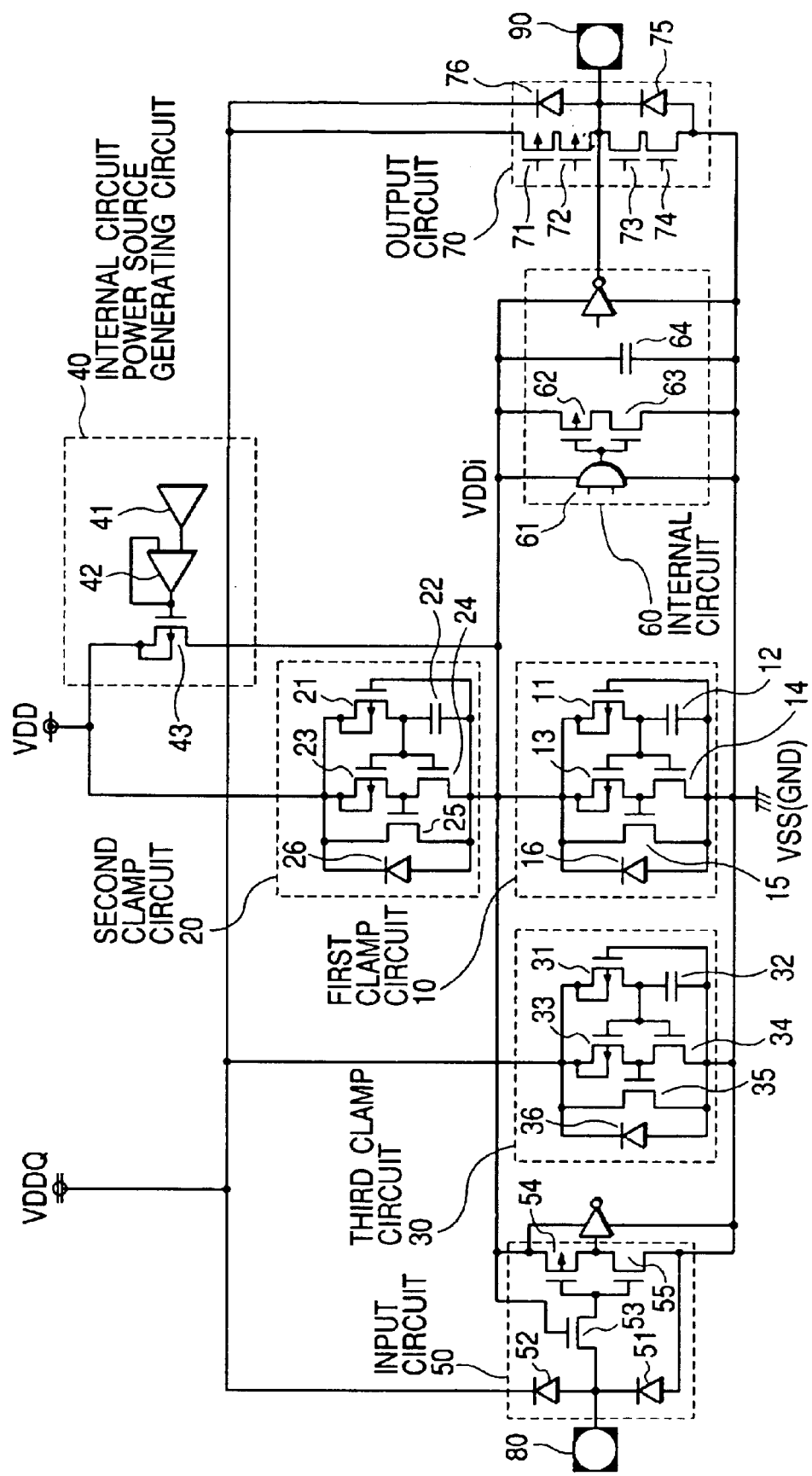
FIG. 1 is a circuit diagram illustrating an example of structure of the principal portion of SRAM as an example of a semiconductor integrated circuit of the present invention.

FIG. 1 illustrates a circuit configuration of the principal portion in the SRAM.

The high potential side power source VDD and the lower potential side power source VSS are given via the input terminal. Although not particularly restricted, the high potential side power source VDD is set to 2.5V, while the low potential power source VSS to 0V (ground GND level). A power source generating circuit 40 for internal circuit is provided and this power source circuit 40 generates a power source VDDi for internal circuit by dropping an output voltage of the high potential side power source VDD. The first clamp circuit 10 for clamping the voltage of unwanted level and the second clamp circuit 20 vertically stacked on the first circuit are provided between the high potential side power source VDD which is supplied from the external circuit and the low potential side power source VSS. These two clamp circuits 10, 20 are vertically stacked in order to use a MOS transistor by lowering a voltage level applied to the MOS transistor even when the high potential side power source VDD exceeding the dielectric strength of the MOS transistor is supplied due to miniaturization of the MOS transistor. An intermediate node 100 formed by vertical stacking of the first clamp circuit 10 and second clamp circuit 20 is coupled with the power source VDDi for the internal circuit. Moreover, an input terminal 80 for fetching the signal from the external side is also provided and the signal fetched through this input terminal 80 is then supplied into the chip with an input circuit 50. The input circuit 50 is operated when the power source VDDi for internal circuit is supplied. Furthermore, an output circuit 70 is also provided to output the signal to the external circuit. This output circuit 70 is operated when the power source VDDQ for I/O (input/output) circuit is supplied from the external side.

The power source generating circuit 40 for internal circuit is comprised of, although not particularly restricted, a p-channel MOS transistor 43 coupled with the high potential side power souce VDD and a reference voltage generating circuit 41 for generating the reference voltage and generates the power source VDDi for internal circuit by controlling the p-channel MOS transistor 43. The voltage level of the power source VDDi for internal circuit is set, although not particularly restricted, to 1.2V.

The first clamp circuit 10 is configured as follows.

The reference voltage can be obtained from a serial connecting point by connecting in serial a p-channel MOS transistor 11 coupled with the power source VDDi for internal circuit and a capacitor 12 coupled with the low potential side power source VSS. This reference voltage is kept at a constant value within the period determined by the time constant of the resistance element of the p-channel MOS transistor 11 and the capacitor 12 even if the voltage level of the power source VDDi for internal circuit rises up to unwanted voltage value. A p-channel MOS transistor 13 coupled with the power source VDDi for internal circuit and an n-channel MOS transistor 14 coupled with the low potential side power source VSS are connected serially to form an inverter. To the gate electrodes of these MOS transistors 13, 14, the reference voltage of the serial connection node of the p-channel MOS transistor 11 and capacitor 12 is supplied. An n-channel MOS transistor 16 is also provided to be able to form a short-circuit of the power source VDDi for internal circuit and the low potential side power source VSS. To the gate electrode of the MOS transistor 16, an output signal of the inverter comprised of the MOS transistors 13, 14 is transferred. A parasitic diode 16 also exists between the source and drain of the MOS transistor 15.

According to the structure described above, during the normal operation, the MOS transistor 13 is turned OFF, while the MOS transistor 14 is turned ON because the reference voltage of the serial connection node of the MOS transistor 11 and capacitor 12 is supplied to the gate electrodes of MOS transistors 13, 14. In this timing, the MOS transistor 15 is turned OFF. Meanwhile, when the voltage level of the power source VDDi for internal circuit momentarily rises up to unwanted voltage level, the p-channel MOS transistor 13 is turned ON, while the n-channel MOS transistor 14 is turned OFF. Accordingly, the n-channel MOS transistor 15 becomes conductive and thereby the voltage of unwanted level of the power source VDDi for internal circuit is clamped. Moreover, since the parasitic diode 16 is also provided, when the voltage of the low potential side power source VSS rises up to unwanted level, the voltage is clamped because a current flows into the power source VDDi for internal circuit via the parasitic diode 16.

The second clamp circuit 20 is configured as described below.

The reference voltage can be obtained from a serial connection point by serially connecting a p-channel MOS transistor 21 coupled with the high potential side power source VDD and a capacitor 22 coupled with the power source VDDi for internal circuit. This reference voltage is kept at a constant value within the period determined with the time constant of the resistance element of the p-channel MOS transistor 21 and the capacitor 22, even if the voltage level of the high potential side power source VDD rises up to unwanted value. A p-channel MOS transistor 23 coupled with the high potential side power source VDD and an n-channel MOS transistor 24 coupled with the power source VDDi for internal circuit are connected in serial to form an inverter. To the gate electrodes of the MOS transistors 23, 24, the reference voltage of the serial connecting node of the p-channel MOS transistor 21 and capacitor 22 is supplied. An n-channel MOS transistor 25 is also provided to be able to form a short-circuit of the high potential side power source VDD and the power source VDDi for internal circuit. To the gate electrode of the MOS transistor 25, an output signal of the inverter comprised of the MOS transistors 23, 24 is transferred. A parasitic diode 26 is also provided between the source and drain of the MOS transistor 25.

The third clamp circuit 30 is configured as described below.

The reference voltage can be obtained from a serial connection point by serially connecting a p-channel MOS transistor 31 coupled with the power source VDDQ for I/O circuit and a capacitor 32 coupled with the low potential side power source VSS. This reference voltage is kept at the constant voltage within the period determined by a time constant of the resistance element of the p-channel MOS transistor 31 and the capacitor 32 even when the voltage level of the power source VDDQ for I/O circuit rises up to the unwanted value. A p-channel MOS transistor 33 coupled with the power source VDDQ for I/O circuit and an n-channel MOS transistor 34 coupled with the low potential side power source VSS are connected in serial to form an inverter. To the gate electrodes of the MOS transistors 33, 34, the reference voltage of the serial connection node of the p-channel MOS transistors 31 and 32 is supplied. Moreover, an n-channel MOS transistor 35 is also provided to be able to form a short-circuit of the power source VDDQ for I/O circuit and the low potential side power source VSS. To the gate electrode of this MOS transistor 35, an output signal of the inverter consisting of the MOS transistors 33, 34. A parasitic diode 36 exists between the drain and source of the MOS transistor 35.

Since the clamping operation in this structure is similar to that of the first clamp circuit 10 and the second clamp circuit 20, the detail description of this clamping operation will be omitted here.

The internal circuit 60 includes, although not particularly restricted, a principal internal logic in this RAM. For example, the memory cell array and its peripheral circuits not illustrated are included in this internal circuit 60. In FIG. 1, as an example of the internal circuit 60, a 2-input AND gate and MOS transistors 62, 63 allocated in the subsequent stage of this gate are typically illustrated. Since the dielectric strength of the MOS transistor forming such internal circuit 60 is lowered due to introduction of ultra-miniaturization of structure, the power source VDDi for the internal circuit which has been obtained by stepping down the voltage of the high potential side power source VDD is supplied to this MOS transistor. An output signal of the internal circuit, for example, a read data from the memory cell array can be outputted to an external circuit via an output circuit 70. Moreover, the internal circuit 60 is provided, in many areas, with capacitors 64 in order to reduce noise element included in the power source VDDi for internal circuit when these are connected to the power source VDDi for internal circuit and the low potential side power source VSS. Since the capacitors 64 are provided in many areas as described above, the combined capacitance of these capacitors becomes large and impedance thereof is therefore controlled to a small value.

An input circuit 50 includes, although not particularly restricted, n-channel MOS transistors 53, 55 and a p-channel MOS transistor 54. An inverter to fetch an input signal is formed by serially connecting the p-channel MOS transistor 54 coupled with the power source VDDi for internal circuit and the n-channel MOS transistor 55 coupled with the low potential side power source VSS. The n-channel MOS transistor 53 is provided between the MOS transistors 54, 55 and an input terminal 80 for inputting the signal. The gate electrode of this MOS transistor 53 is coupled with the power source VDDi for internal circuit. Moreover, the diodes 51, 52 are also provided to prevent static electricity breakdown of the MOS transistor forming the input circuit 50. The diode 51 is provided between the signal input route to the MOS transistor 53 from the input terminal 80 and the low potential side power source VSS, while the diode 52 is provided between the power source VDDQ for I/O circuit and the above signal input route.

An output circuit 70 includes, although not particularly restricted, the MOS transistors 71 to 74 for outputting the signal to the external circuit via an output terminal 90 and the diodes 75, 76 for preventing static electricity breakdown of the elements of this input circuit. The MOS transistors forming this output circuit 70 such as MOS transistors 71 to 74 are operated when the power source VDDQ for I/O circuit is supplied.

Figure 3:
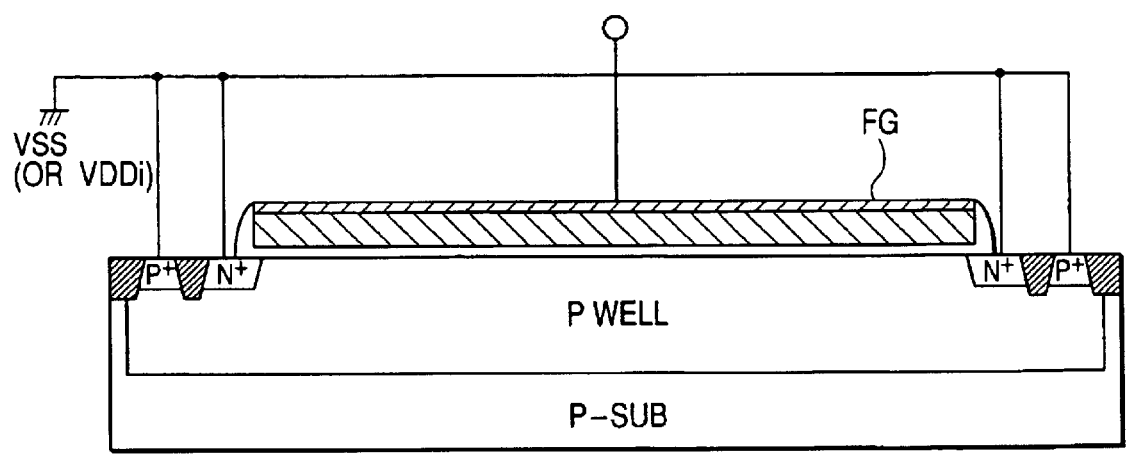
FIG. 3 is a cross-sectional view of a capacitor included in the circuit illustrated in FIG. 1.

The capacitors 12, 22, 32, 64 used in each circuit described above may be formed, although not particularly restricted, of MOS capacitors using the gate oxide film as illustrated in FIG. 3. Namely, since the semiconductor regions ($P^+$, $N^+$) corresponding to the source electrode or drain electrode are connected in common to the low potential side power source VSS (or power source VDDi for internal circuit), the MOS capacitance formed against the gate electrode FG may be utilized.

As the static electricity dielectric strength evaluation method of semiconductor integrated circuit device, the HBM (Human Body Model) system, MM (Machine Model) system and CDM (Charged Device Model) system are known. In the HBM system, the waveform when the static electricity accumulated in a human body is discharged to a semiconductor integrated circuit device is simulated. In the MM system, the waveform when the static electricity accumulated in a machine is discharged to a semiconductor integrated circuit device is simulated. In the CDM system, the condition where static electricity accumulated in a package of semiconductor integrated circuit device is discharged is simulated. In any system described above, when a current path of low resistance is formed via the clamp circuit, the voltage of unwanted level is never impressed to the MOS transistor, and therefore relevant MOS transistor can be protected from breakdown. Operations of the clamp circuit will be described with reference to FIG. 4 to FIG. 7 based on the examples of the HBM system and CDM system. For the convenience of description, a wiring resistance existing on the wiring of the high potential side power source VDD is expressed as rd, while a wiring resistance existing on the wiring of the low potential side power source VSS is expressed as rs, and a wiring resistance existing on the wiring of the power source VDDQ for I/O circuit is expressed as rq.

Figure 4:
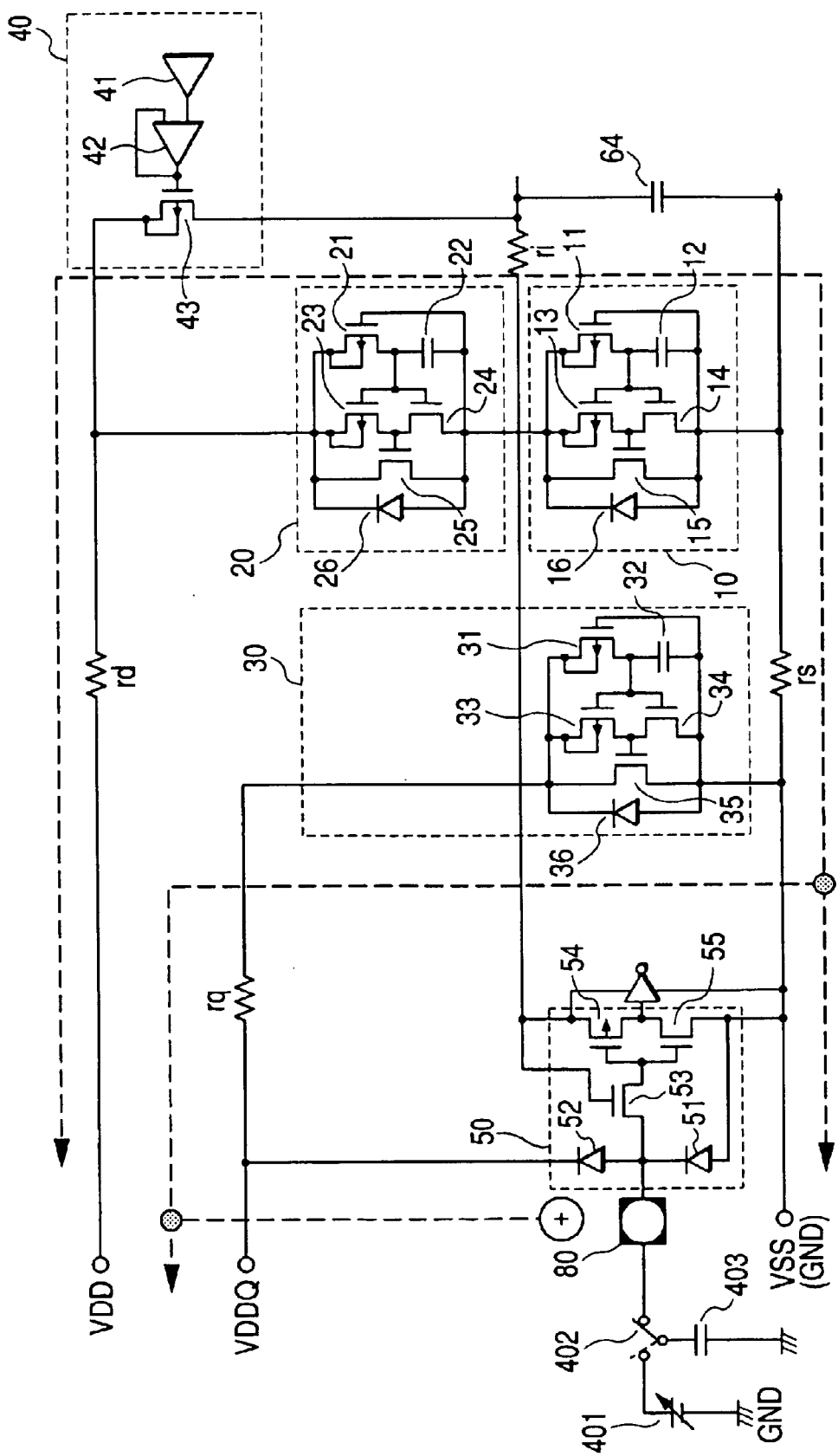
FIG. 4 is a circuit diagram for describing evaluation of dielectric strength for static electricity breakdown of the circuit illustrated in FIG. 1.

FIG. 4 illustrates the condition where the positive charges are supplied to the input terminal 80 in the HBM system.

When the positive side of the DC power source (for example, 150V) is coupled with the capacitor 403 under the condition that the switch 402 is in the condition illustrated by a broken line, the capacitor 403 is charged. Next, the static electricity dielectric strength evaluation is performed when the accumulated charge (positive side) of the capacitor 403 is supplied to the input terminal 80 because the switch 402 is switched as illustrated with a solid line. This evaluation is classified into three kinds of standards of the VSS standard, VDD standard and VDDQ standard.

In the case of VSS standard, only the input terminal of the low potential side power source VSS is set to the ground level, and the accumulated charge (positive side) of the capacitor 403 is supplied to the input terminal under this condition. In this case, the other input terminals are opened. In the case of this VSS standard, since a current flows into the current path extended to the low potential side power source VSS via the input terminal 80, diode 52, wiring of the power source VDDQ for I/O circuit and the n-channel MOS transistor 35 which becomes conductive with application of unwanted voltage, it is avoided that the voltage of unwanted level is applied to the electrodes of MOS transistors 53, 54, 55 forming the input circuit 50.

In the case of the VDD standard, only the input terminal of the high potential side power source VDD is set to the ground level and the accumulated charge (positive side) of the capacitor 403 is supplied, under this condition, to the input terminal 80. In this timing, the other input terminals are opened. In the case of this VDD standard, since a current flows into the current path extended to the high potential side power source VDD via the input terminal 80, diode 52, wiring of the power source VDD for I/O circuit, n-channel MOS transistor 35 which becomes conductive with application of unwanted voltage, wiring of the low potential side power source VSS and diodes 16, 26, it can be avoided that the voltage of unwanted level is applied to the electrodes of the MOS transistors 53, 54, 55 forming the input circuit 50.

In the case of the VDDQ standard, only the input terminal of the power source VDDQ for I/O circuit is set to the ground level and the accumulated charge (positive side) of the capacitor 403 is supplied to the input terminal 80 under this condition. In this timing, the other input terminals are opened. In the case of this VDDQ standard, since a current flows into the current path extended to the power source VDDQ for I/O circuit via the input terminal 80 and diode 52, it can be avoided that the voltage of unwanted level is applied to the electrodes of the MOS transistors 53, 54, 55 forming the input circuit 50.

Figure 5:
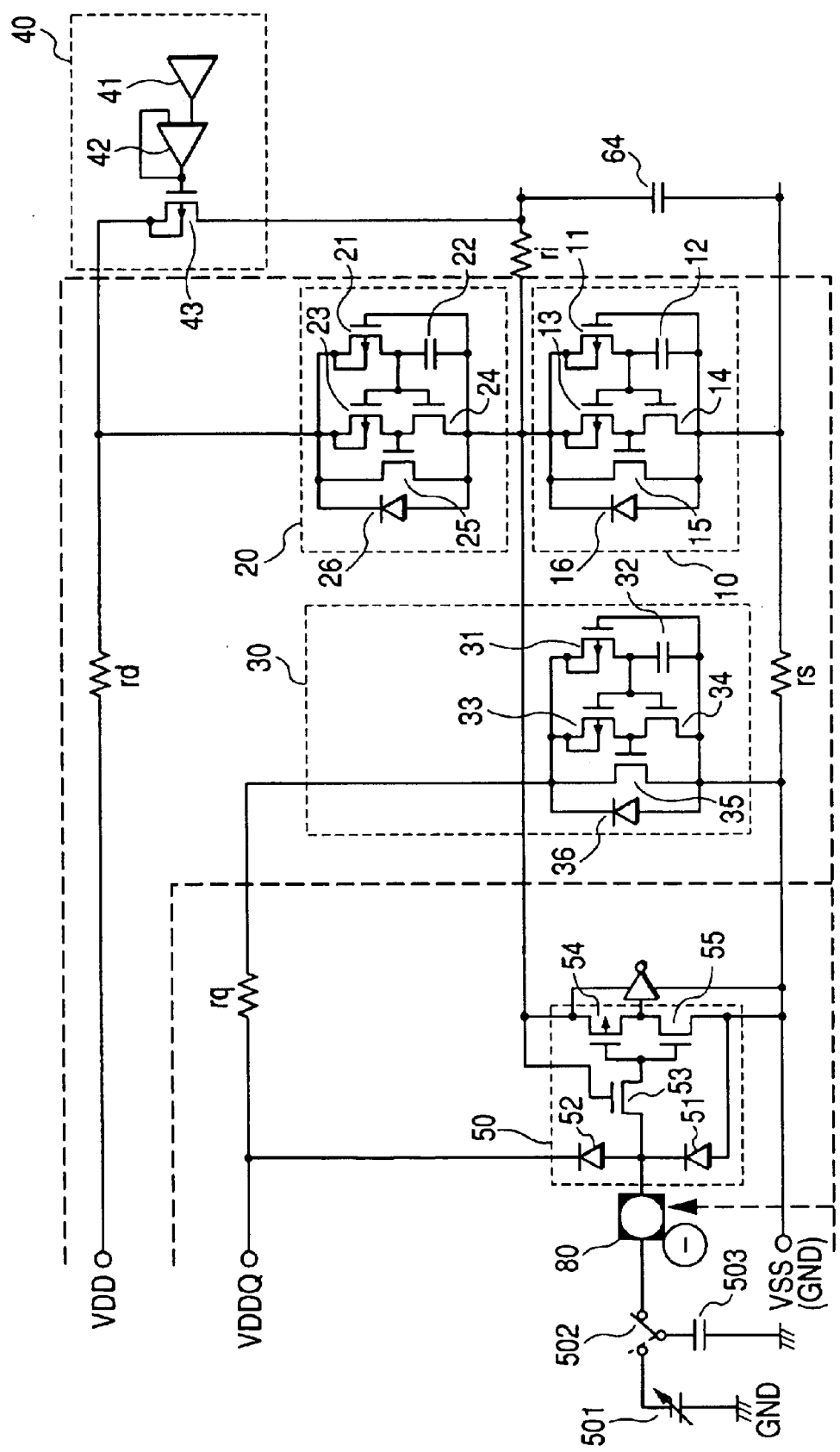
FIG. 5 is a circuit diagram for describing evaluation of dielectric strength for static electricity breakdown of the circuit illustrated in FIG. 1.

FIG. 5 illustrates the condition where charge of the negative side is supplied to the input terminal 80 in the HBM system.

Since the negative side of the DC power source (for example, 150V) is coupled with the capacitor 403 under the condition that the switch 502 is indicated with a broken line, the capacitor 403 is charged. Next, when the switch 502 is switched as indicated with a solid line, the accumulated charge (negative side) of the capacitor 403 is supplied to the input terminal 80 and thereby static electricity dielectric strength is evaluated. This evaluation is classified into three kinds of standards of the VSS standard, VDD standard and VDDQ standard.

In the case of the VSS standard, only the input terminal of the low potential side power source VSS is set to the ground level and the accumulated charge (negative side) of the capacitor 403 is supplied under this condition to the input terminal 80. In this case, the other input terminals are opened. In this VSS standard, since a current flows into the input terminal of the low potential side power source VSS and the current path extended from the wiring to the input terminal 80 via the diode 51, it can be avoided that the voltage of unwanted level is applied to the electrodes of the MOS transistors 53, 54, 55 forming the input circuit 50.

In the case of the VDD standard, only the input terminal of the high potential side power source VDD is set to the ground level and the accumulated charge (negative side) of the capacitor 403 is supplied under this condition to the input terminal 80. In this timing, the other input terminals are opened. In the case of this VDD standard, since a current flows into the input terminal of the high potential side power source VDD and the current path extended, from the wiring, to the input terminal 80 via the n-channel MOS transistors 25, 15 which become conductive when the voltage of unwanted level is applied, wiring of the low potential side power source VSS and diode 51 from, it can be avoided that the voltage of unwanted level is applied to the electrodes of the MOS transistors 53, 54, 55 forming the input circuit 50.

In the case of the VDDQ standard, only the input terminal of the power source VDDQ for I/O circuit is set to the ground level and the accumulated charge (negative side) of the capacitor 403 is supplied under this condition to the input terminal 80. In this timing, the other input terminals are opened. In this VDDQ standard, since a current flows into the input terminal of the power source VDDQ for I/O circuit and the current path extended, from the wiring, to the input terminal 80 via the n-channel MOS transistor 35 which becomes conductive when the voltage of unwanted level is applied, wiring of the low potential side power source VSS and diode 51, it is avoided that the voltage of unwanted level is applied to the electrodes of the MOS transistors 53, 54, 55 forming the input circuit 50.

In FIG. 4 and FIG. 5, a voltage is generated, when the charge moves into the SRAM from the capacitor 403, due to the wiring resistances rs, rd, rq and the ON-resistance of the MOS transistors 15, 25, 35 in the clamp circuits 10, 20, 30. Therefore, constants of the elements are set so that this voltage level does not exceed the dielectric strength of the MOS transistors.

Figure 6:
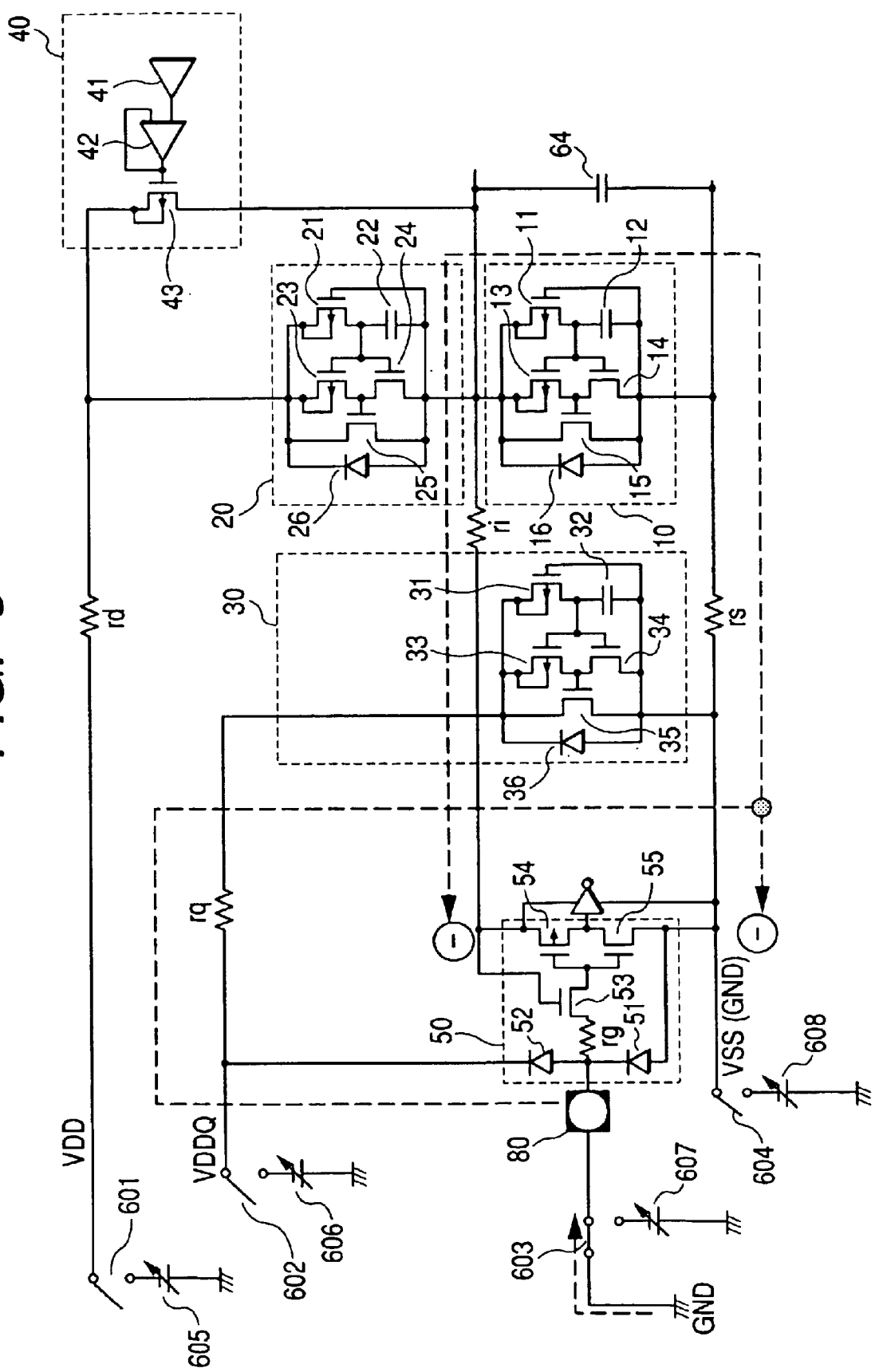
FIG. 6 is a circuit diagram for describing evaluation of dielectric strength for static electricity breakdown of the circuit illustrated in FIG. 1.

FIG. 6 illustrates the condition that the negative potential charged via the input terminal 80 is discharged in the CDM system.

After charges are accumulated to an SRAM when the negative sides of the DC power source (for example, 200V) 605, 608, 606, 607 are supplied, via the switches 601, 604, 602, 603, to all terminals including the input terminal of low potential side power source VSS, input terminal of the power source VDDQ for I/O circuit and input terminal 80 of signal, the switches 601, 604, 602 are turned OFF and the input terminal 80 is terminated to the ground GND (low potential side power source VSS level) through the switching of the switch 603. In this timing, a current flows into the current path which is extended, from the input terminal 80, to the input circuit 50 via the wiring of the diode 52, n-channel MOS transistor 35 which becomes conductive when the unwanted voltage is applied and the low potential side power source VSS. Moreover, a current also flows into the current path which is extended, from the input terminal 80, to the input circuit 50 via the wiring of the diode 52, n-channel MOS transistor 35 which becomes conductive when the unwanted voltage is applied, diode 16 and power source VDDi for internal circuit. Accordingly, it is avoided that the voltage of unwanted level is impressed to the electrodes of the MOS transistors 53, 54, 55 forming the input circuit 50.

Figure 7:
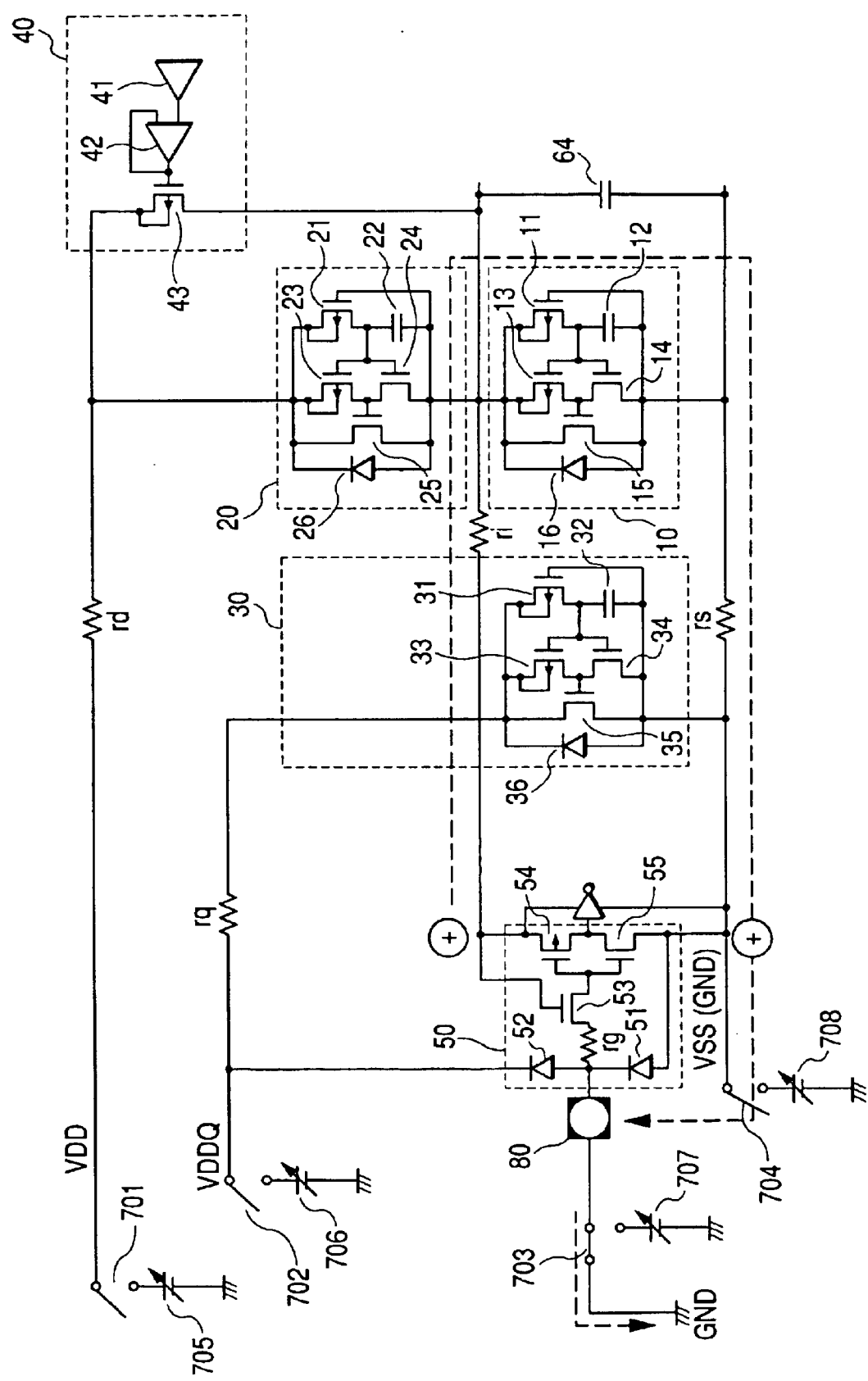
FIG. 7 is a circuit diagram for describing evaluation of dielectric strength for static electricity breakdown of the circuit illustrated in FIG. 1.

FIG. 7 illustrates the condition that the positive potential charged via the input terminal 80 is discharged in the CDM system.

After charges are accumulated to an SRAM when the positive sides of the DC power source (for example, 200V) 705, 708, 706, 707 are supplied, via the switches 701, 704, 702, 703, to all terminals including the input terminal of the low potential side power source VSS, input terminal of power source VDDQ for I/O circuit, and input terminal 80 of signal, the switches 701, 704, 702 are turned OFF and the input terminal 80 is terminated to the ground GND (low potential side power source VSS level) through the switching of the switch 703. In this timing, a current flows into the current path which is extended, from the input circuit 50, to the ground GND via the wiring of the low potential side power source VSS, diode 51 and input terminal 80. Moreover, a current also flows into the current path which is extended, from the input circuit 50, to the ground GND via the wiring of the power source VDDi for internal circuit, n-channel MOS transistor 15 which becomes conductive when unwanted voltage is applied, wiring of the low potential side power source VSS, diode 51 and input terminal 80 and thereby, it is avoided that the voltage of unwanted level is applied to the electrodes of the MOS transistors 53, 54, 55 forming the input circuit 50.

In FIG. 6 and FIG. 7, it is assumed that the relationships, rq<rg and rq+rs+ri<rg are established among the input resistance rg of the input circuit 50 and wiring resistances rq, rs, ri.

Here, the circuit which may be compared with the circuit of FIG. 1 will be described with reference to FIG. 2.

When the clamp circuits 10, 20 are stacked in double in the semiconductor integrated circuit to which a power source of the level higher than the dielectric strength of MOS transistor is supplied, an intermediate potential generating circuit 404 which is formed with serial connection of the p-channel MOS transistors 401, 402 is provided at the intermediate node 100 which is formed by stacking in double the clamp circuit. In this structure, an exclusive MOS transistor to generate the intermediate potential is required to provide a serial connection circuit of two p-channel MOS transistors 401, 402 in view of generating the intermediate potential. Moreover, the predetermined current must be applied for generation of intermediate potential to two p-channel MOS transistors 401, 402 on the occasion of generating the intermediate potential. Accordingly, power consumption of semiconductor integrated circuit increases.

On the other hand, in the structure of FIG. 1, since the power source VDDi for internal circuit which is used as the original operation power source of the internal circuit 60 is supplied to the intermediate node 100, it is no longer required to newly provide the serial connection circuit of two p-channel MOS transistors 401, 402 in order to generate the intermediate potential. Accordingly, it can be prevented that useless current is applied to the serial connection circuit of two p-channel MOS transistors 401, 402.

Next, a chip layout of the SRAM described above will be described.

Figure 8:
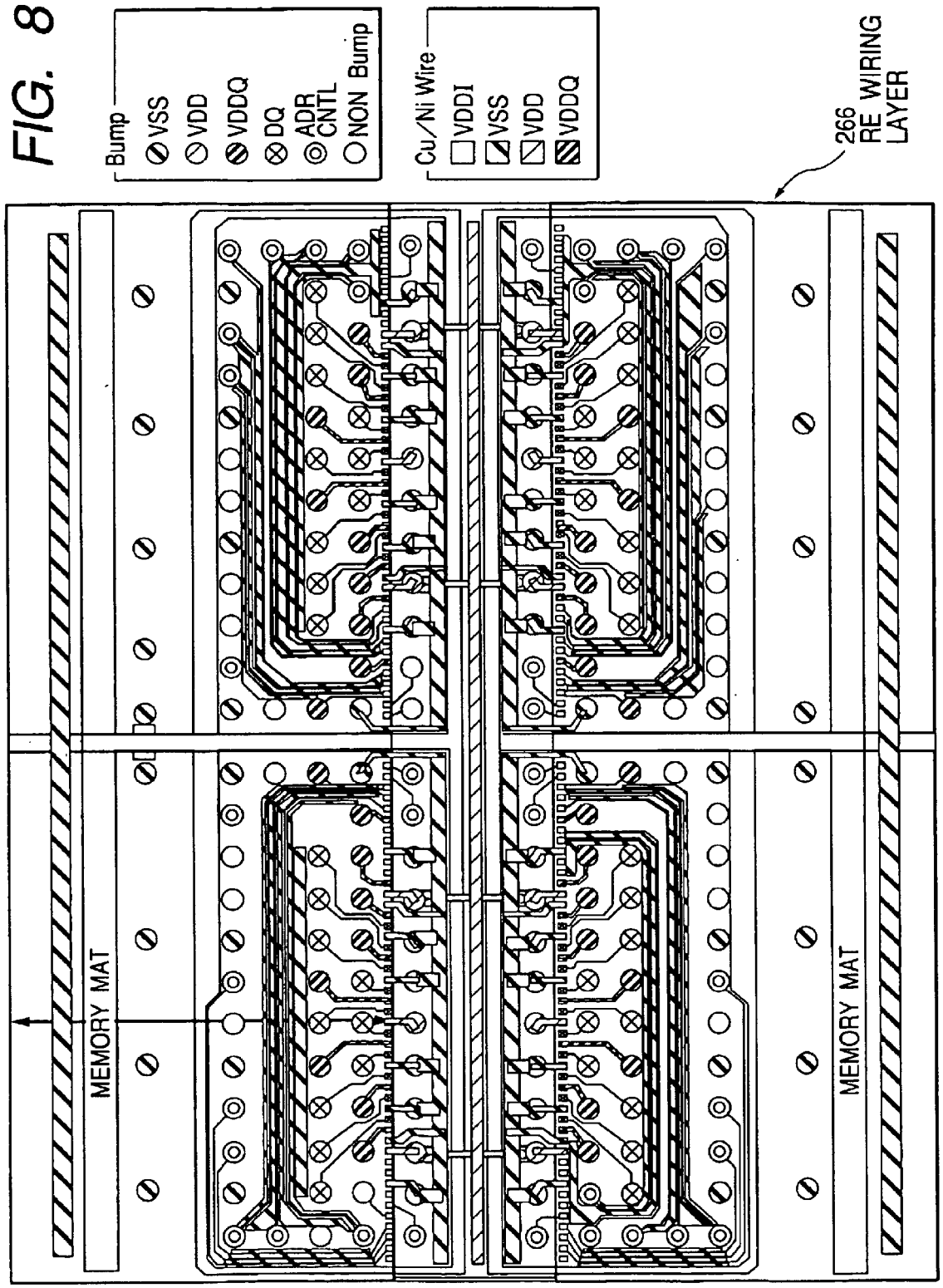
FIG. 8 is a diagram for describing a layout of a re-wiring layer in the SRAM.

FIG. 8 illustrates the layout of the re-wiring layer in the SRAM 102, bump electrodes and pads connected thereto.

In FIG. 8, the bump electrodes are given the circles and small square indicates the pads formed of metal wiring layer. The bump electrode, pad and re-wiring layer are designated as the meshed area, hatched area and colored area for indicating discrimination in the voltages and signals.

The wirings of the low potential side power source VSS, high potential side power source VDD, power source VDDQ for I/O circuit and power source VDDi for internal circuit are formed and these are connected to the corresponding bump electrodes. The low potential side power source VSS, high potential side power source VDD, power source VDDQ for I/O circuit are fetched from the external side via the corresponding bump electrodes and are transferred to each section via the corresponding wirings. The re-wiring layer 266 is formed, although not particularly restricted, of copper (Cu) and nickel (Ni) and has a low resistance. Since voltage-drop due to the wiring resistance can be suppressed to a small value by transferring the low potential side power source VSS, high potential side power source VDD, power source VDDQ for I/O circuit and power source VDDi for internal circuit using such re-wiring layer 266, the power source voltage can be supplied successfully. Moreover, the memory mat allocated in the area except for the center area is formed by allocating a plurality of static memory cells in the shape of matrix.

Figure 9:
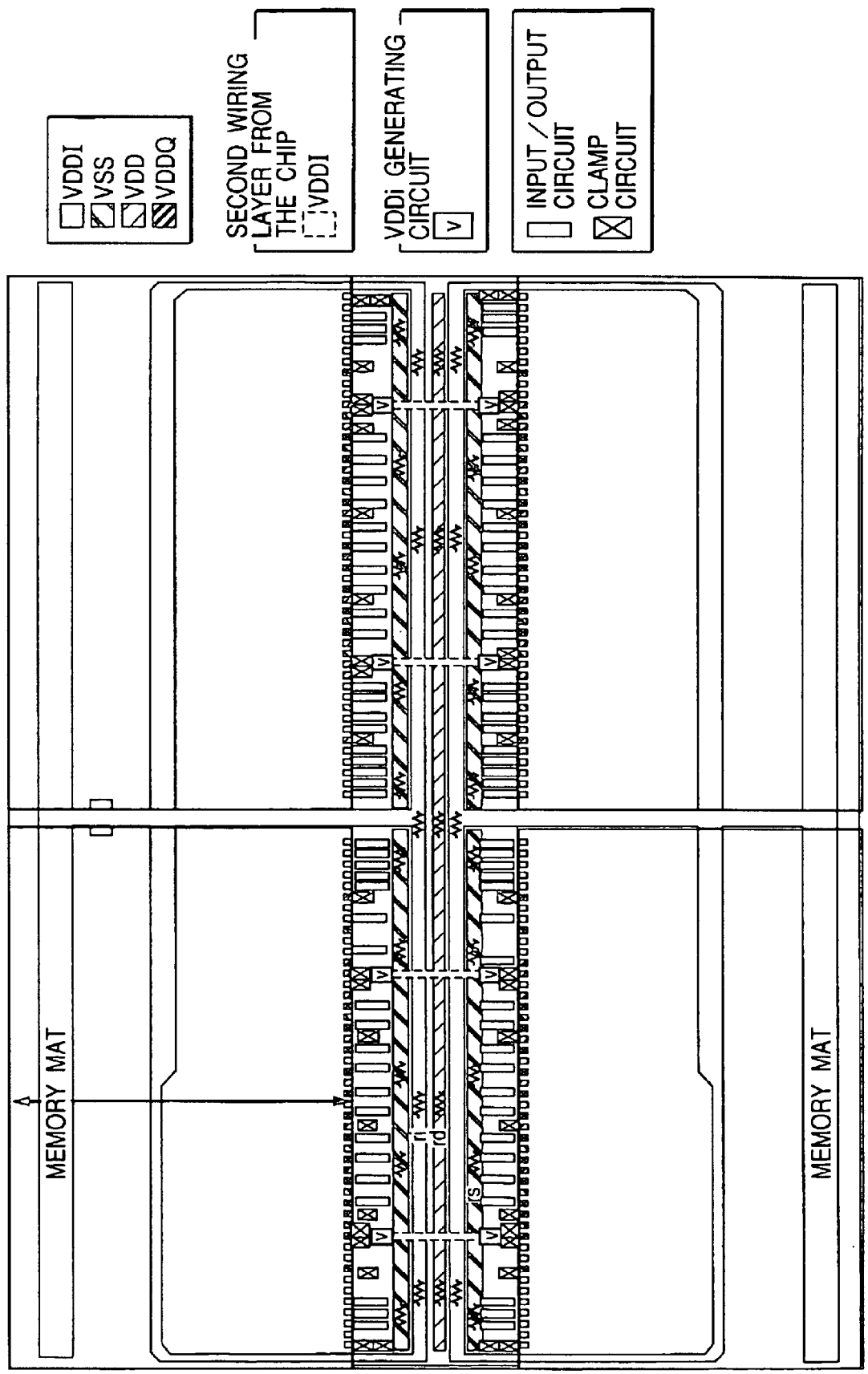
FIG. 9 is a diagram for describing the layout of the re-wiring layer in the SRAM.

FIG. 9 illustrates a layout of the input circuit 50, power source voltage generating circuit for internal circuit (VDDi generating circuit) 40, and clamp circuits 10, 20, 30. In FIG. 9, wiring and bump electrode in the re-wiring layer 266 are omitted to easily see the allocation of the input circuit 50, power source generating circuit for internal circuit (VDDi generating circuit) 40 and clamp circuits 10, 20, 30. As is illustrated in FIG. 9, in order to make small the influence of wiring resistance as much as possible, the input circuit 50, power source generating circuit for internal circuit (VDDi generating circuit) 40 and clamp circuits 10, 20, 30 are scattered to a plurality of locations.

Figure 10:
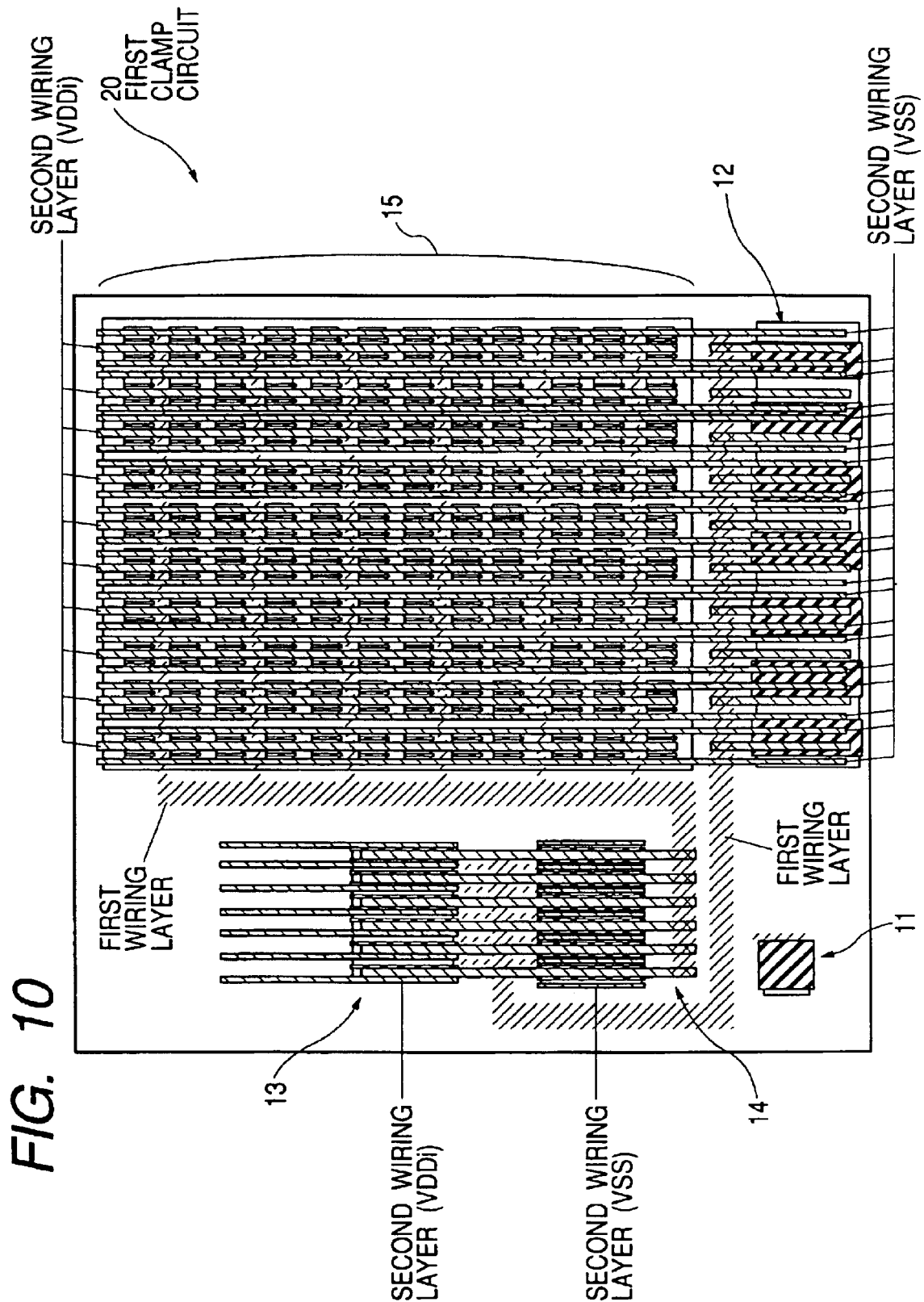
FIG. 10 is a diagram for describing the layout of the re-wiring layer in the SRAM.

FIG. 10 illustrates an example of layout of the first clamp circuit 10.

The p-channel MOS transistor 13 and n-channel MOS transistor 14 are MOS transistors to form an inverter and these MOS transistors are connected in parallel in the equal numbers. The n-channel MOS transistor 15 is MOS transistor for clamp and this MOS transistor is connected in parallel so that various currents can be applied stably. The capacitor 12 utilizes the oxide film of the MOS transistor and many MOS transistors are connected in parallel to make small parasitic resistance of PWELL. The second wiring layer is used for the power source VDDi for internal circuit and the low potential side power source VSS. For the coupling of the MOS transistors 13, 14 and MOS transistor 15 and coupling of the capacitor 12 and MOS transistors 11, 13, 14, the first wiring layer and the second wiring layer are used. In addition, as illustrated in FIG. 11, the low potential side power source VSS and power source VDDi for internal circuit are wired using the third wiring layer.

Figure 12:
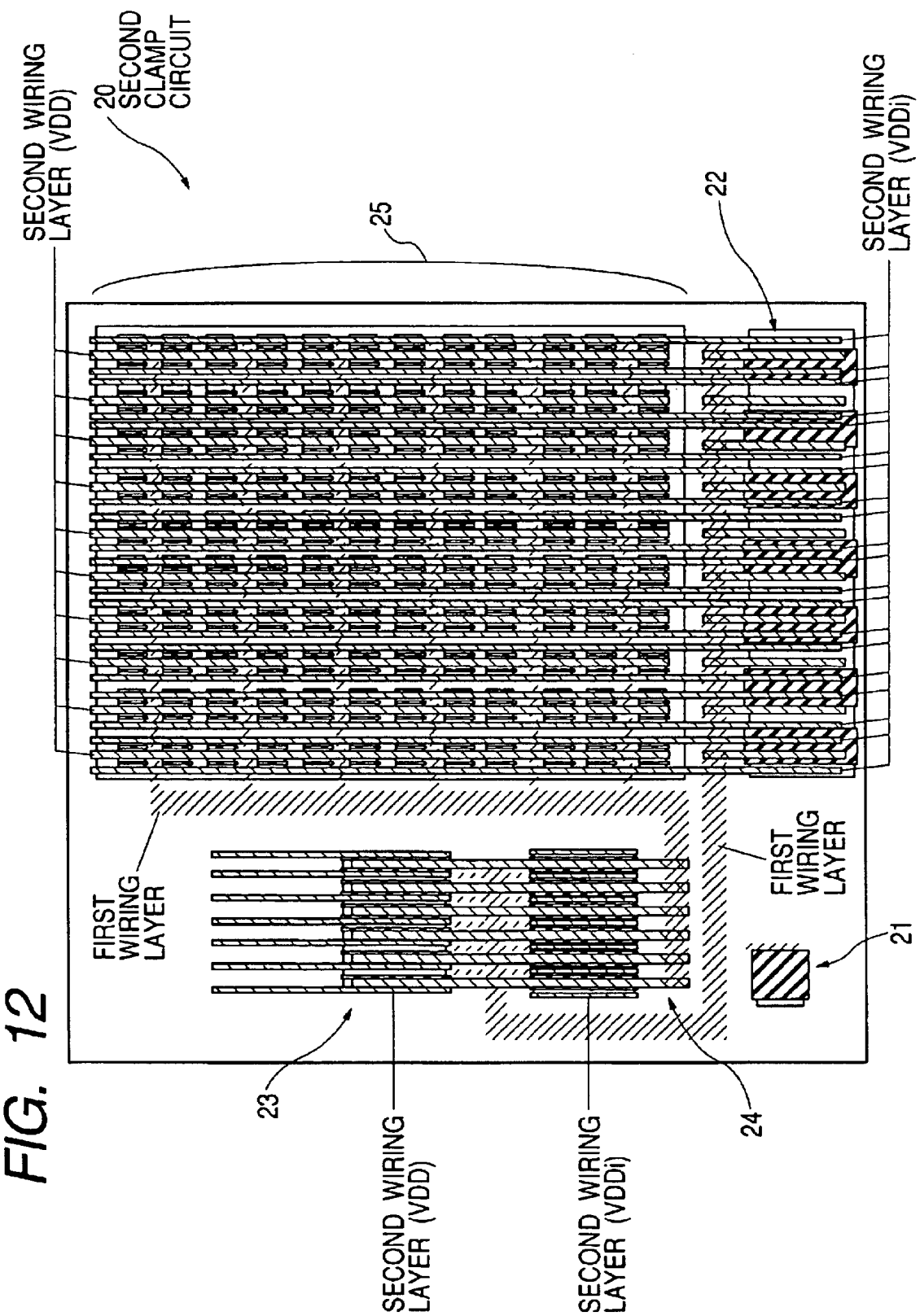
FIG. 12 is a diagram for describing the layout of the second clamp circuit included in the SRAM.

FIG. 12 illustrates an example of layout of the second clamp circuit 20.

Basically, the layout of the second clamp circuit 20 is similar to the layout of the first clamp circuit 10. Namely, The p-channel MOS transistor 23 and n-channel MOS transistor 24 are MOS transistors to form an inverter and these MOS transistors are connected in parallel in the equal numbers. The n-channel MOS transistor 25 is the MOS transistor for clamp. This MOS transistor 25 is connected in parallel so that various currents may be applied stably. The capacitor 22 utilizes an oxide film of the MOS transistor and many MOS transistors are connected in parallel to make small parasitic resistance of the PWELL. For the power source VDDi for internal circuit and high potential side power source VDD, the second wiring layer is used. For the coupling of the MOS transistors 23, 24 and MOS transistor 25 and coupling of the capacitor 22 and MOS transistors 21, 23, 24, the first wiring layer and second wiring layer are used. Moreover, as illustrated in FIG. 13, the high potential side power source VDD and the power source VDDi for internal circuit are wired using the third wiring layer.

Figure 11:
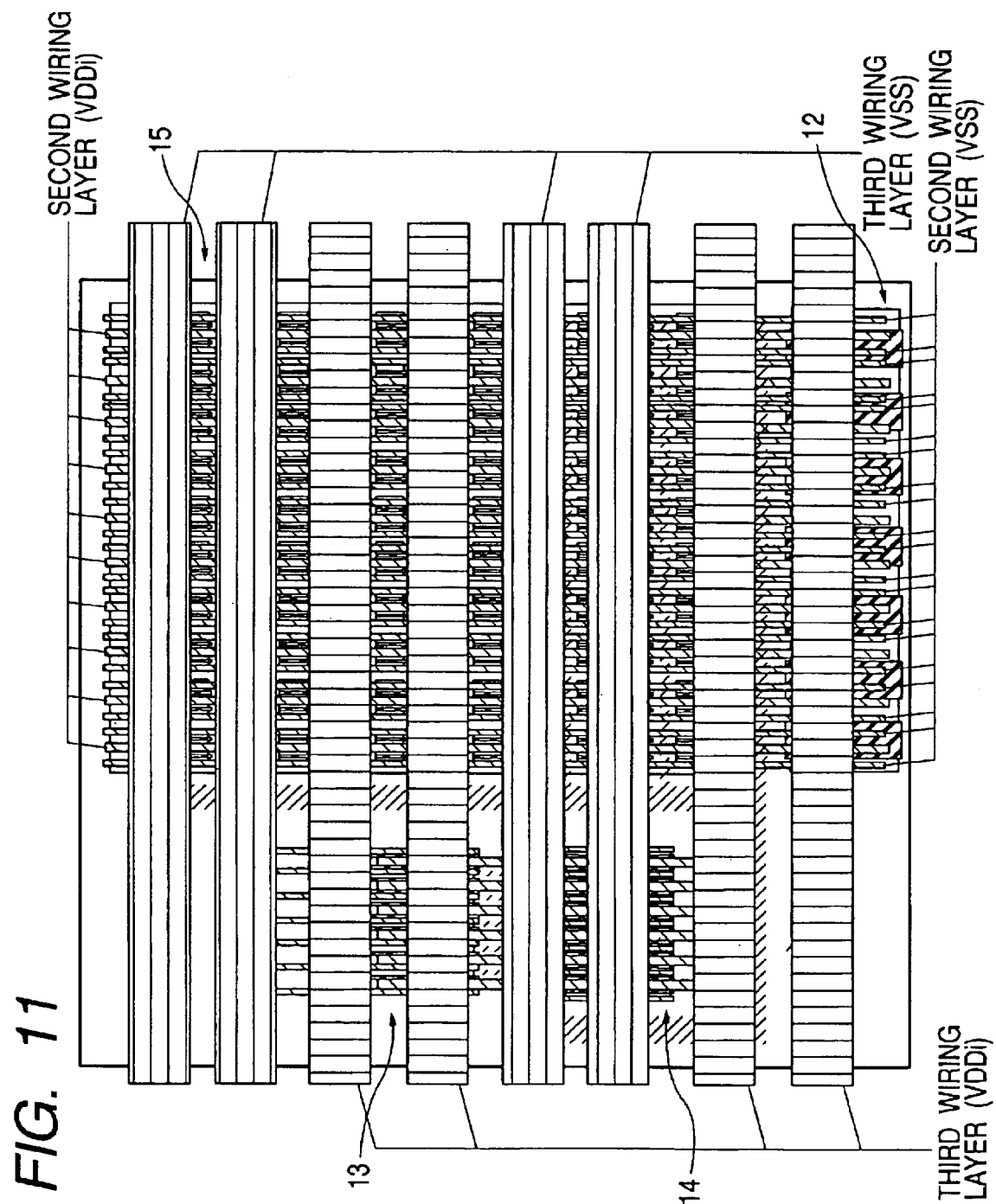
FIG. 11 is a diagram for describing the layout of the re-wiring layer in the SRAM.
Figure 13:
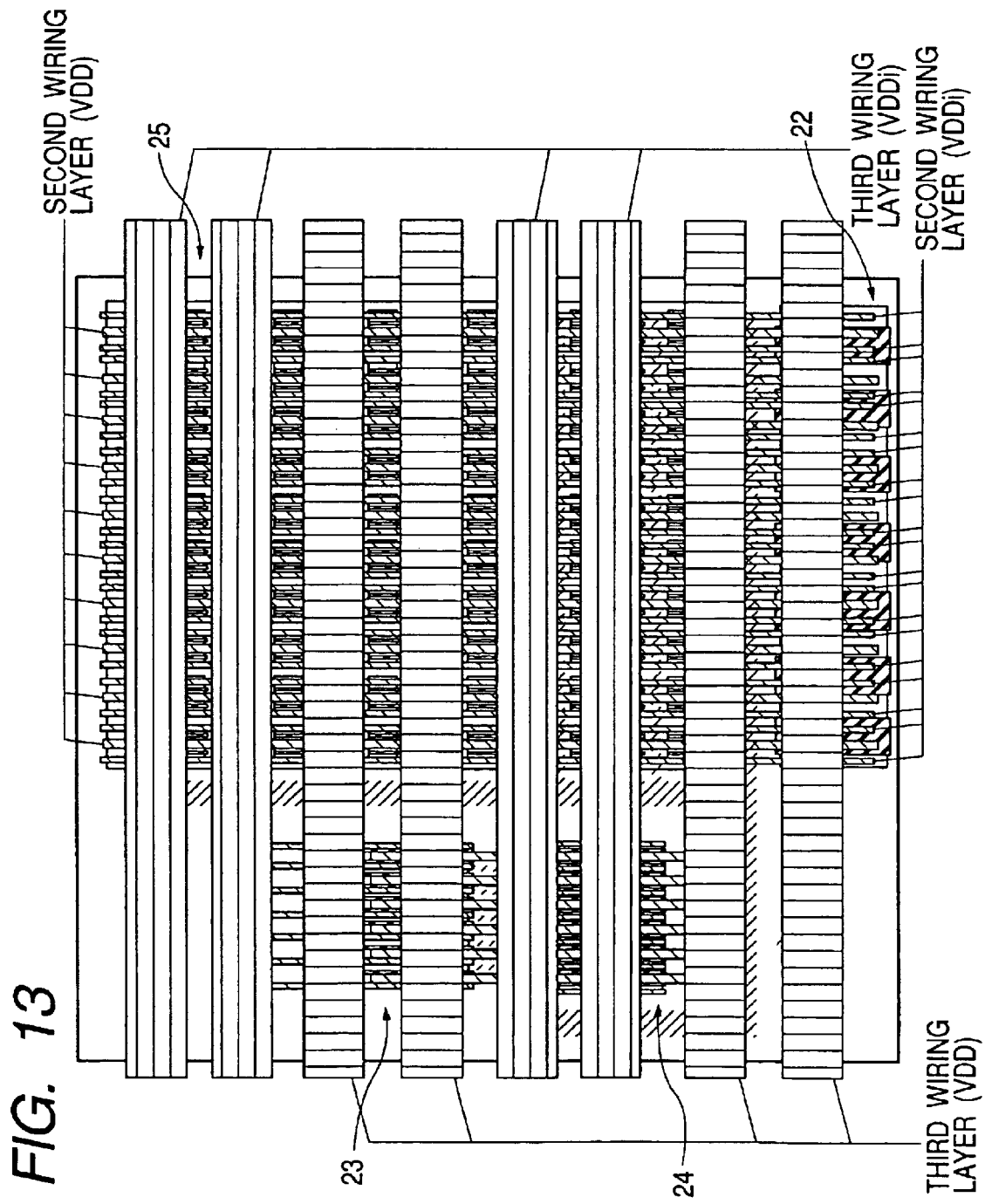
FIG. 13 is a diagram for describing the layout of the second clamp circuit included in the SRAM.
Figure 14:
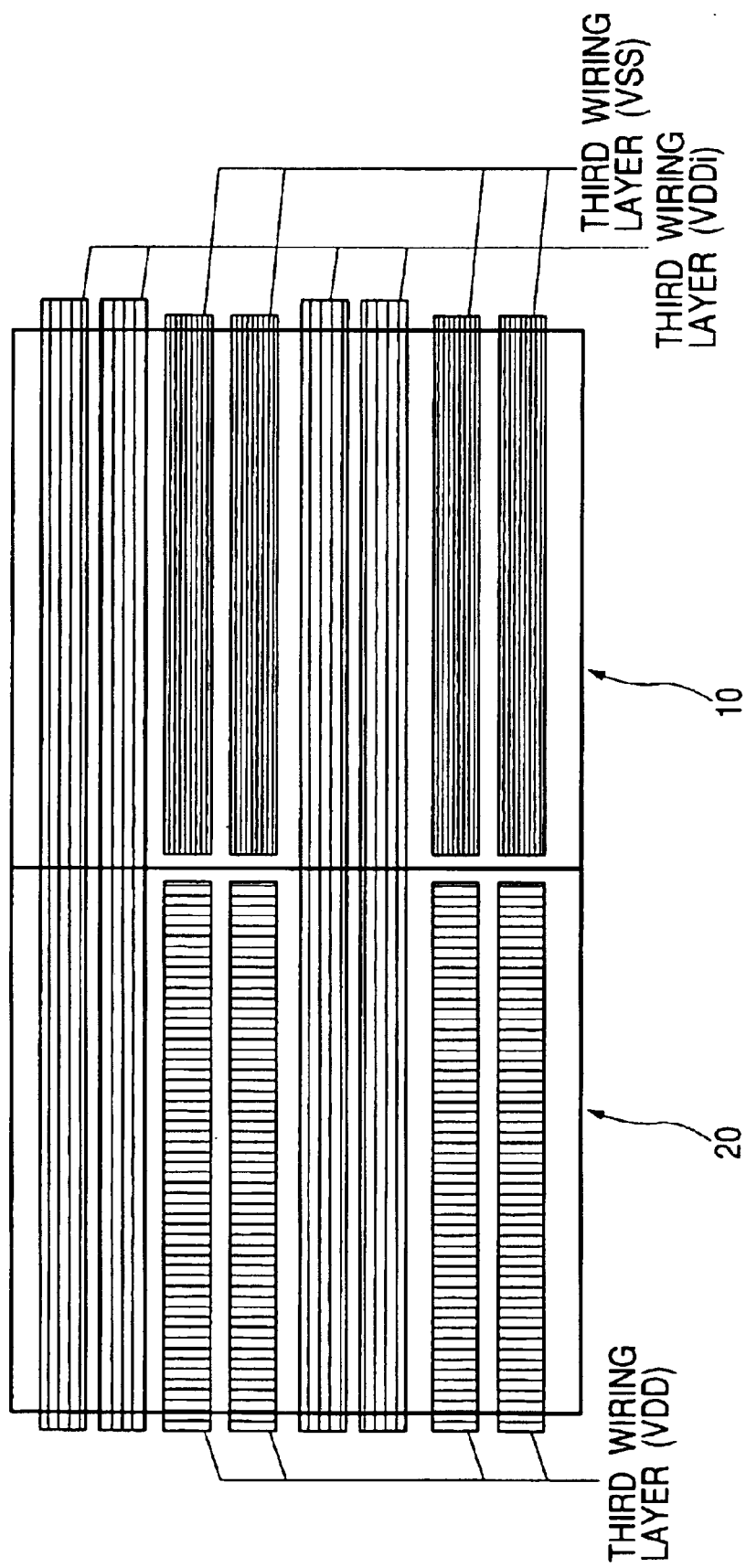
FIG. 14 is a diagram for describing an allocation example of the first clamp circuit and second clamp circuit.
Figure 15:
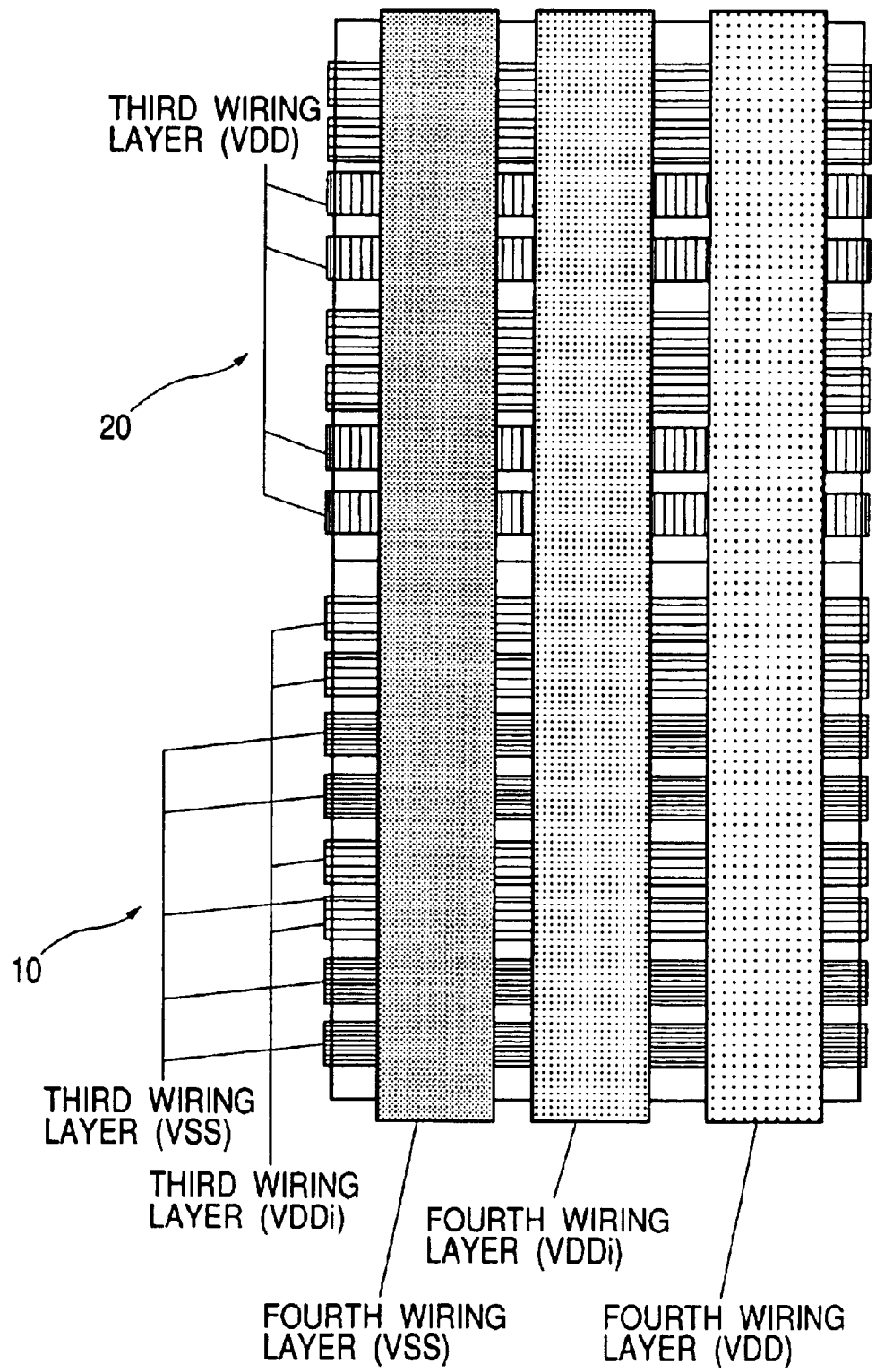
FIG. 15 is a diagram for describing the allocation example of the first clamp circuit and second clamp circuit.

The first clamp circuit 10 illustrated in FIG. 10 and FIG. 11 and the second clamp circuit 20 illustrated in FIG. 12, FIG. 13 may be allocated in parallel in the semiconductor chip as illustrated in FIG. 14. In addition, as illustrated in FIG. 15, these may also be allocated in vertical.

Moreover, in this embodiment, an address signal fetched from the external circuit may also be transferred via the re-wiring layer 266. For example, the address signal wiring is coupled through the re-wiring layer 266 to the typically indicated bump electrodes (indicated with the double-circle) for inputting the address signal or control signal and the address signal is transferred up to the corresponding pads via the address signal wiring. The signal is then transferred to an address register and a pre-decoder from these pads via the metal wiring layer of the semiconductor chip 120. Since the re-wiring layer 266 has a low resistance value, address signal transfer time can be reduced by transferring the address signal using such re-wiring layer 266 because amount of delay of the address signal is rather small.

Moreover, in this embodiment, the address signal wiring is shielded with the wiring of the low potential side power sourve VSS in order to prevent mixing of noise into the address signal wiring and crosstalk from the adjacent address wirings. For example, the wiring of the low potential side power source VSS is also laid along the address signal wiring in both sides. Accordingly, the address signal wiring is shielded with the adjacent wiring of the low potential side power source VSS.

According to the embodiment described above, following effects may be attained.

(1) The clamp between the high potential side power source VDD and low potential side power source VSS may be realized by stacking in two stages the clamp circuits 10, 20 in the SRAM to which the power source of higher level exceeding the dielectric strength of MOS transistor is supplied. Therefore, it is no longer required to provide an exclusive MOS transistor for clamp circuit having higher dielectric strength.

Figure 2:
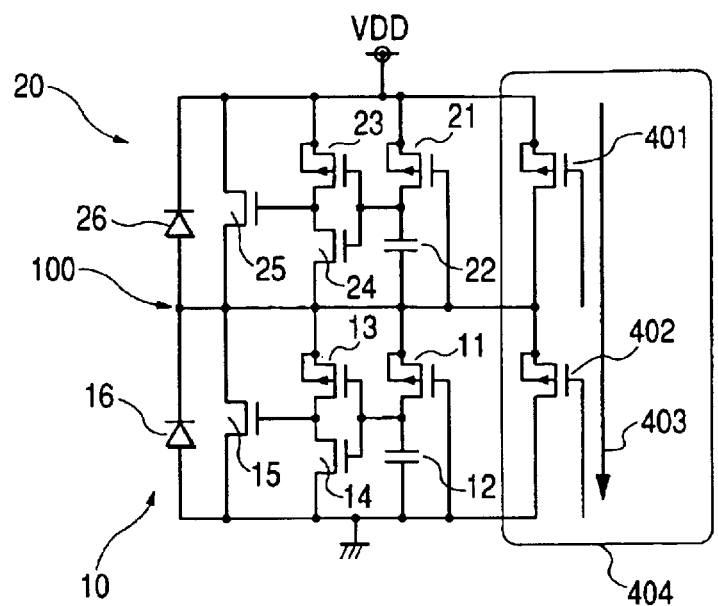
FIG. 2 is a circuit diagram illustrating an example of structure of the circuit compared with the circuit illustrated in FIG. 1.

(2) When the intermediate potential generating circuit 404 which is formed by serial connection of the p-channel MOS transistors 401, 402 is provided at the intermediate node 100 where the clamps circuits 10, 20 are stacked in two stages in the semiconductor integrated circuit to which the power source of higher level exceeding the dielectric strength of MOS transistor is applied as illustrated in FIG. 2, the exclusive MOS transistor to generate the intermediate potential is required and moreover the predetermined current to generate the intermediate potential must be applied to two p-channel MOS transistors 401, 402 for generation of the intermediate potential and thereby the power consumption of the semiconductor integrated circuit is so far increased. Meanwhile, in the structure illustrated in FIG. 1, since the power source VDDi for internal circuit which is the original operation power source voltage of the internal circuit 60 is supplied to the intermediate node 100, it is no longer required to newly provide the serial connection circuit of two p-channel MOS transistors 401, 402 to generate the intermediate potential. Accordingly, it can be prevented that useless current is applied to the serial connection circuit of two p-channel MOS transistors 401, 402.

(3) The internal circuit 60 is provided with many capacitors 64 in various areas through connection of the power source VDDi for internal circuit and low potential side power source VSS in order to reduce noise included in the power source VDDi for internal circuit. Since the capacitors 64 are provided in various areas, the combined capacitance of these capacitors becomes large and impedance thereof is suppressed to a lower value. In the structure to supply the power source VDDi for internal circuit to the intermediate node 100, since the capacitor 64 in the internal circuit 60 is connected between the intermediate node 100 and low potential side power source VSS, impedance between the intermediate node 100 and low potential side power supply VSS can be set to a lower value. Since the impedance is set to such a small value, potential difference due to an over-current flowing into the chip is also reduced to a small value. Therefore, a large over-current may be allowed to flow and static electricity dielectric strength can be set to a larger value.

The present invention has been described above practically, but the present invention is not limited to above description and allows various changes and modifications within the scope not departing from the claims thereof.

Figure 16:
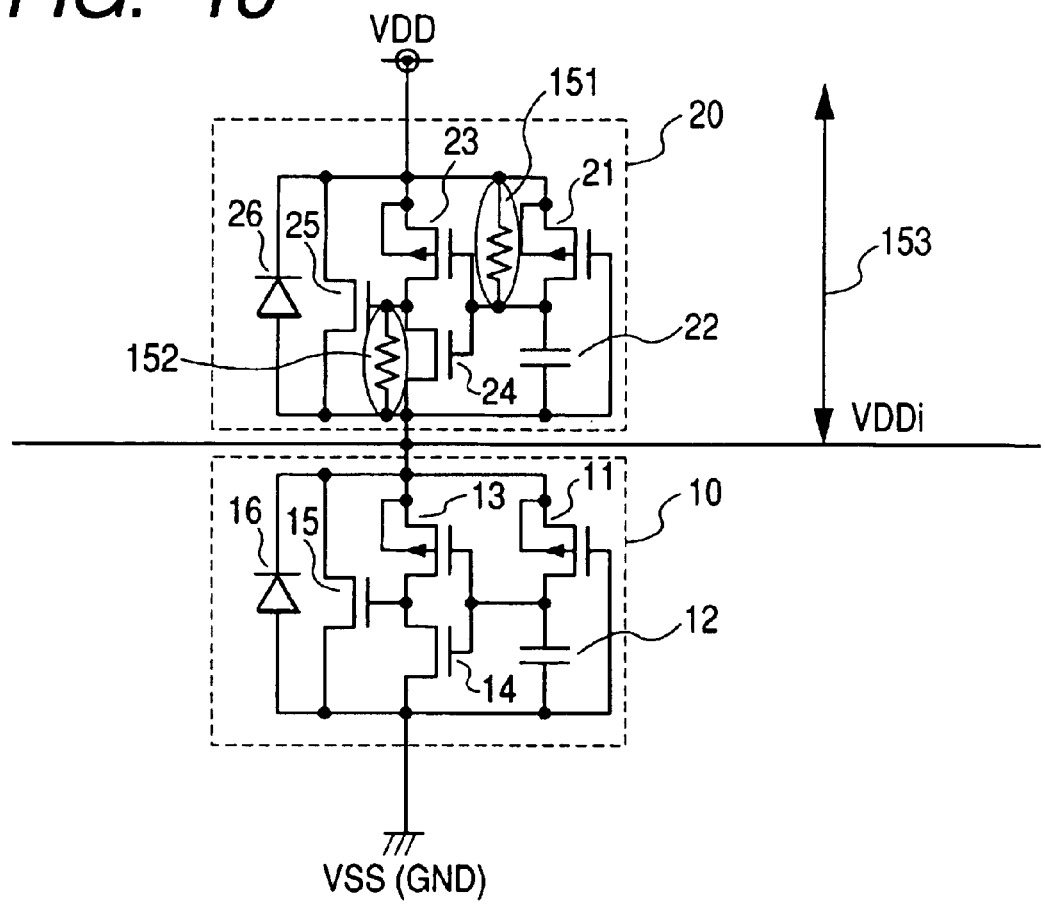
FIG. 16 is a circuit diagram of an example of the other structure of the second clamp circuit.

For example, since a voltage level of the high potential side power source VDD supplied from an external circuit is set to a lower value, the voltage level of the power source VDDi for internal circuit sometimes becomes higher than the half of the voltage level of the high potential side power source VDD. For instance, in FIG. 16, when the voltage level of the power source VDDi for internal circuit is 1.2V, it is supposed that the high potential side power source voltage VDD is dropped to 1.5V. In this case, a voltage difference 153 between the high potential side power source VDD and power source VDDi for internal circuit is as low as 0.3V, the p-channel MOS transistor 13 and n-channel MOS transistor 25 in the second clamp circuit 2 cannot be turned OFF sufficiently during the normal operation. Therefore, a though-current flows into the relevant MOS transistor.

As described above, when the voltage difference 153 between the high potential side power source VDD and power source VDDi for internal circuit is too low, the gate voltage of the p-channel MOS transistor 13 is set to the high level which is enough to turn OFF the relevant MOS transistor 13 by connecting in parallel a high resistance 151 to the p-channel MOS transistor 11. Moreover, the gate voltage of the n-channel MOS transistor 25 is set to the low level which is enough to turn OFF the relevant MOS transistor by connecting in parallel a high resistance 152 to the n-channel MOS transistor 14. Accordingly, it can be avoided that a through-current flows into the p-channel MOS transistor 13 and n-channel MOS transistor 25.

In addition, in above embodiment, the diode 52 for preventing static electricity breakdown in the input circuit 50 is coupled with the power source VDDQ for I/O circuit, but this diode for preventing static electricity breakdown may also be coupled with the high potential side power source VDD depending on the structure of various input circuits connected to the input terminal.

In above description, the present invention has been applied to the SRAM which is the major application field as the background thereof. But, the present invention is not limited thereto and may also be widely applied to various semiconductor integrated circuit devices.

The present invention may be applied under the condition that the semiconductor integrated circuit device includes an internal circuit which may be operated when the power source for internal circuit lower than the voltage of at least high potential side power source is supplied.

The effects of the typical inventions of the present invention will be described briefly.

Namely, since the power source voltage for internal circuit which is originally used as the operation power source of the internal circuit is supplied to the intermediate node, the capacitor which is also originally provided in the internal circuit is allocated in parallel with the first clamp circuit. Accordingly, unwanted voltage level can be clamped in a low impedance. Since the impedance is set to a lower value, potential difference due to an over-current flowing in the chip can be lowered. Therefore, a large over-current is allowed to flow and static electricity breakdown voltage can be set to a higher value.

What is claimed is:

1. A semiconductor integrated circuit device comprising:
   a first input terminal for receiving a high potential side power source;
   a second input terminal for receiving a low potential side power source;
   an internal circuit, including a first terminal for receiving a power source for internal circuit which is lower than voltage of said high potential side power source, to be operated by receiving said power source thereof; and
   a first clamp circuit and a second clamp circuit respectively for clamping unwanted level voltages,
   wherein said first and second clams circuits are connected in series between said first input terminal and said second input terminal and an intermediate node between said first clamp circuit and said second clamp circuit is connected to said first terminal, and
   wherein said internal circuit comprises: logic circuits formed of thin film transistors coupled with said power source for internal circuit; and capacitors for noise reduction provided between said power source for internal circuit and said low potential side power source.

2. The semiconductor integrated circuit device according to claim 1, further comprising:
   a power source generating circuit for internal circuit to generate the power source for internal circuit by stepping down said high potential side power source.

3. The semiconductor integrated circuit device according to claim 1, wherein said first clamp circuit and said second clamp circuit are identical in structure.

4. A semiconductor integrated circuit device comprising:
   a first input terminal for receiving a high potential side power source;
   a second input terminal for receiving a low potential side power source;
   an internal circuit, including a first terminal for receiving a power source for internal circuit which is lower than voltage of said high potential said power source, to be operated by receiving said power source thereof;
   a first clamp circuit and a second clamp circuit respectively for clamping unwanted level voltages;
   an output circuit for outputting signals to external circuits when the power source for said output circuit which is different from said power source for internal circuit is supplied thereto; and
   a third clamp circuit for clamping unwanted level voltage,
   wherein said first and second clamp circuits are connected in series between said first input terminal and said second input terminal and an intermediate node between said first clamp circuit and said second clamp circuit is connected to said first terminal.

5. The semiconductor integrated circuit device according to claim 4, further comprising:
   an input terminal and an input circuit which is operated when said power source for internal circuit is supplied to fetch the signal transferred via said input terminal,
   wherein said input circuit comprises an input transistor for fetching the signal inputted via the input terminal and a diode for preventing static electricity breakdown forming a conductive route to said power source for said input circuit.

* * * * *